(12) United States Patent
Yao et al.

(10) Patent No.: US 12,309,957 B2
(45) Date of Patent: May 20, 2025

(54) MULTI-NODE SERVER, CABINET SERVER, AND BLADE SERVER

(71) Applicant: Huawei Technologies Co., Ltd., Shenzhen (CN)

(72) Inventors: Yimin Yao, Shenzhen (CN); Yiwei Fan, Shenzhen (CN); Cheng Huang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 166 days.

(21) Appl. No.: 18/187,008

(22) Filed: Mar. 21, 2023

(65) Prior Publication Data

US 2023/0232564 A1 Jul. 20, 2023

Related U.S. Application Data

(63) Continuation of application No. PCT/CN2021/117848, filed on Sep. 11, 2021.

(30) Foreign Application Priority Data

Sep. 24, 2020 (CN) .......................... 202011019515.8

(51) Int. Cl.
| | |
|---|---|
| G06F 1/16 | (2006.01) |
| G06F 1/18 | (2006.01) |
| G06F 1/20 | (2006.01) |
| H05K 5/00 | (2025.01) |
| H05K 7/00 | (2006.01) |
| H05K 7/14 | (2006.01) |

(52) U.S. Cl.
CPC ........... *H05K 7/1487* (2013.01); *G06F 1/187* (2013.01); *G06F 1/189* (2013.01); *G06F 1/20* (2013.01)

(58) Field of Classification Search
CPC .......... G06F 1/187; G06F 1/189; G06F 1/183; H05K 7/1487; H05K 7/1488; H05K 7/1489; H05K 7/1492; H05K 7/1494
See application file for complete search history.

(56) References Cited

U.S. PATENT DOCUMENTS

| | | | |
|---|---|---|---|
| 9,232,678 B2 * | 1/2016 | Bailey | H05K 7/1492 |
| 2010/0008038 A1 * | 1/2010 | Coglitore | G06F 1/20 |
| | | | 361/679.48 |

(Continued)

FOREIGN PATENT DOCUMENTS

CN 107656588 A 2/2018

*Primary Examiner* — Anthony M Haughton
(74) *Attorney, Agent, or Firm* — Slater Matsil, LLP

(57) ABSTRACT

A multi-node server includes a plurality of nodes and a hard disk backplane. Each node includes a power supply module. The power supply module is built in the node. The hard disk backplane is connected to the plurality of nodes through a first connector. The power supply module of each node is connected to a power supply interface of another node through a second connector, where the first connector and the second connector are spaced apart, and air flowing from an air inlet of the multi-node server circulates through a spacing between the first connector and the second connector. A system backplane for connection is not arranged in the multi-node server, but is replaced with the first connector and the second connector with a relatively small volume.

20 Claims, 10 Drawing Sheets

(56) References Cited

U.S. PATENT DOCUMENTS

| | | | |
|---|---|---|---|
| 2011/0292597 A1* | 12/2011 | Carter | G06F 1/20 |
| | | | 361/679.54 |
| 2012/0188719 A1* | 7/2012 | El-Essawy | G06F 1/18 |
| | | | 361/701 |
| 2015/0116913 A1 | 4/2015 | Kwon et al. | |
| 2016/0262282 A1* | 9/2016 | Li | H05K 7/1489 |
| 2017/0052801 A1* | 2/2017 | Nguyen | G06F 1/26 |
| 2017/0127549 A1* | 5/2017 | Lunsman | H05K 7/20763 |
| 2017/0127550 A1* | 5/2017 | Heinrichs | H05K 7/1438 |
| 2017/0127575 A1* | 5/2017 | Lunsman | H05K 7/20263 |
| 2017/0168975 A1* | 6/2017 | Heinrichs | H04L 41/00 |
| 2018/0063988 A1* | 3/2018 | Ehlen | H05K 5/0247 |
| 2019/0012288 A1* | 1/2019 | Zhao | G06F 13/4282 |
| 2020/0100382 A1* | 3/2020 | Frink | H05K 7/1485 |

\* cited by examiner

MULTI-NODE SERVER, CABINET SERVER, AND BLADE SERVER

CROSS-REFERENCE TO RELATED APPLICATIONS

This application a continuation of International Application No. PCT/CN2021/117848, filed on Sep. 11, 2021, which claims priority to Chinese Patent Application No. 202011019515.8, filed on Sep. 24, 2020. The disclosures of the aforementioned applications are hereby incorporated by reference in their entireties.

TECHNICAL FIELD

This application relates to the field of server technologies, and in particular, to a multi-node server, a cabinet server, and a blade server.

BACKGROUND

As a requirement for an operational capability of a server increases, an intensive server emerges. A plurality of nodes can be deployed on the intensive server. Each of the plurality of nodes can be used as an independent server for operation. Such a server can also be referred to as a multi-node server.

At present, because one multi-node server can be deployed with a plurality of nodes, the multi-node server has a relatively strong operational capability and relatively high power consumption. Therefore, the multi-node server needs to have a relatively strong heat dissipation capability. There is a limitation on arrangement of components in the multi-node server. A hard disk backplane and a system backplane are used as an example. The hard disk backplane and the system backplane are perpendicular to an air direction of an inlet of the server, which hinders circulation of air in the server to some extent and is not conductive to heat dissipation of the server. In addition to the hard disk backplane and the system backplane, positions of the nodes in the multi-node server and components such as a power supply module outside the nodes also hinder the circulation of the air in the server. Consequently, such a multi-node server has a relatively poor heat dissipation capability.

SUMMARY

This application provides a server, a cabinet server, and a blade server to improve a heat dissipation capability of the server.

According to a first aspect, an embodiment of this application provides a multi-node server. The multi-node server includes a plurality of nodes and a hard disk backplane. Each node includes a power supply module. The power supply module is built in the node.

The hard disk backplane is connected to the plurality of nodes through a first connector. Each node may be connected to the first connector through a cable. The hard disk backplane may be connected to the first connector through a cable.

The power supply module of each node is connected to a power supply interface of another node through a second connector, where the first connector and the second connector are spaced apart, and air flowing from an air inlet of the multi-node server circulates through a spacing between the first connector and the second connector.

According to the server, a system backplane for connection is not arranged in the multi-node server, but is replaced with the first connector and the second connector with a relatively small volume, so that the hard disk backplane can be connected to the plurality of nodes, and the power supply modules of the nodes can be connected to the power supply interfaces of other nodes. Therefore, the air in the multi-node server can better circulate while ensuring reliability of the node server, thereby increasing a ventilation volume of the multi-node server and improving a heat dissipation capability of the multi-node server. In addition, the nodes with the built-in power supply modules can effectively reduce a volume occupied by an external power supply module in the multi-node server, reduce obstruction to the air in the multi-node server, and ensure the heat dissipation capability of the multi-node server.

In a possible design, the second connector and the first connector are located on a same plane, and the plane is located between the plurality of nodes and the hard disk backplane.

According to the server, the first connector is located between the plurality of nodes and the hard disk backplane, so that the first connector can be better connected to the plurality of nodes and the hard disk backplane. The second connector and the first connector are located on the same plane, thereby improving reasonableness of arrangement of components in the multi-node server, and effectively utilizing the space in the multi-node server.

In a possible design, the power supply module of each node is connected to the second connector through a copper bar, and there is a spacing between a plurality of copper bars connecting the power supply modules of the plurality of nodes and the second connector.

According to the server, the power supply modules and the second connector can be connected through the flat copper bars, so that an occupied volume can be reduced. Therefore, more air can circulate in the multi-node server. In addition, there is the spacing between the plurality of copper bars, which also ensures the circulation of the air in the multi-node server.

In a possible design, the first connector is arranged close to a side surface of the multi-node server. For example, the first connector may be next to the side surface of the multi-node server. In this way, obstruction to the air flowing into the multi-node server can be reduced, and the heat dissipation capability of the multi-node server can be ensured.

In a possible design, the second connector is arranged toward the power supply interfaces of the nodes, so that the second connector is connected to the power supply interfaces. In addition, the second connector is further arranged in the middle of the multi-node server and is far away from the side surface of the multi-node server. In this way, the second connector can be close to the power supply interface of each node, thereby ensuring the reasonableness of the arrangement of the components of the multi-node server.

In a possible design, the power supply modules and the power supply interfaces of the nodes are located on different side surfaces of the nodes; and the copper bars connecting the power supply modules of the plurality of nodes may be bent along the side surface of the multi-node server to the plane on which the second connector is located and are connected to the second connector. The copper bars are arranged along the side surfaces of the multi-node server, so that air resistance of the copper bars to the air in the multi-node server can be further reduced, so as to ensure the heat dissipation capability of the multi-node server.

In a possible design, the copper bars connecting the power supply modules of the plurality of nodes are fastened on a side surface of the second connector by using a first structural member. Fastening the copper bars using the first structural member can ensure stability of the copper bars to ensure that the copper bars can be connected to the second connector.

In a possible design, the copper bars are fastened on a junction of the side surface of the multi-node server and the plane on which the second connector is located by using a second structural member. Through the second structural member, it can be ensured that the copper bars can keep a stable state at the junction.

In a possible design, the hard disk backplane is parallel to an air inflow direction of the air inlet in the multi-node server or an air outflow direction of an air outlet in the multi-node server.

According to the server, the hard disk backplane is parallel to the air direction, so that the obstruction to the air can be reduced, and the heat dissipation capability of the multi-node server can be improved.

In a possible design, at least one hard disk is plugged into the hard disk backplane, and the hard disk is plugged into the hard disk backplane in a direction parallel to the air inflow direction of the air inlet or the air outflow direction of the air outlet.

According to the server, the hard disk is plugged into the hard disk backplane along the air direction. In this way, the obstruction by the hard disk to the air in the multi-node server can be greatly reduced, thereby increasing a ventilation volume and ensuring the heat dissipation capability of the multi-node server.

In a possible design, the hard disk backplane includes a plurality of layers of PCBs, and each layer of PCB is arranged in parallel. That is, each layer of PCB is parallel to the air direction of the air that flows into or out of the server. A hard disk slot is arranged on each layer of PCB, and each hard disk in the server may be plugged into each hard disk slot.

According to the server, the backplane uses a layered structure, to ensure that an abundant supply of hard disks can further be plugged into the backplane when the ventilation volume in the server is ensured.

In a possible design, a spacing is reserved between adjacent PCBs in the plurality of layers of PCBs in the direction perpendicular to the air inflow direction of the air inlet or the air outflow direction of the air outlet.

According to the server, there is the spacing between adjacent PCBs, and the air flowing into the server can circulate through the spacing, so that heat gathered on components in the components of the multi-node server can be taken away, to achieve a better heat dissipation effect.

In a possible design, the multi-node server further includes a fan, and the fan is located between the hard disk backplane and the first connector, or located between the hard disk backplane and the plurality of nodes. The fan can generate air and drive the air to flow.

According to the server, the fan is located between the hard disk backplane and the first connector, so that the air generated by the fan can quickly pass through main components in the multi-node server, thereby reducing the heat gathered on these components.

In a possible design, a height of the multi-node server is 2 U; a quantity of the nodes is 4; and the multi-node server includes N internal memories, where N is a positive integer greater than 16.

According to the server, compared with other 2 U4 servers, the multi-node server does not require an external power supply module and a system backplane, so that an available volume is increased. Therefore, more internal memories can be arranged in the multi-node server, thereby improving a storage capability of the multi-node server.

According to a second aspect, an embodiment of the present invention provides a cabinet server. The cabinet server includes one or more servers provided in the first aspect or any one of the designs of the first aspect.

According to a third aspect, an embodiment of the present invention provides a blade server. The blade server includes one or more servers provided in the first aspect or any one of the designs of the first aspect.

DETAILED DESCRIPTION OF ILLUSTRATIVE EMBODIMENTS

Figure 1A:
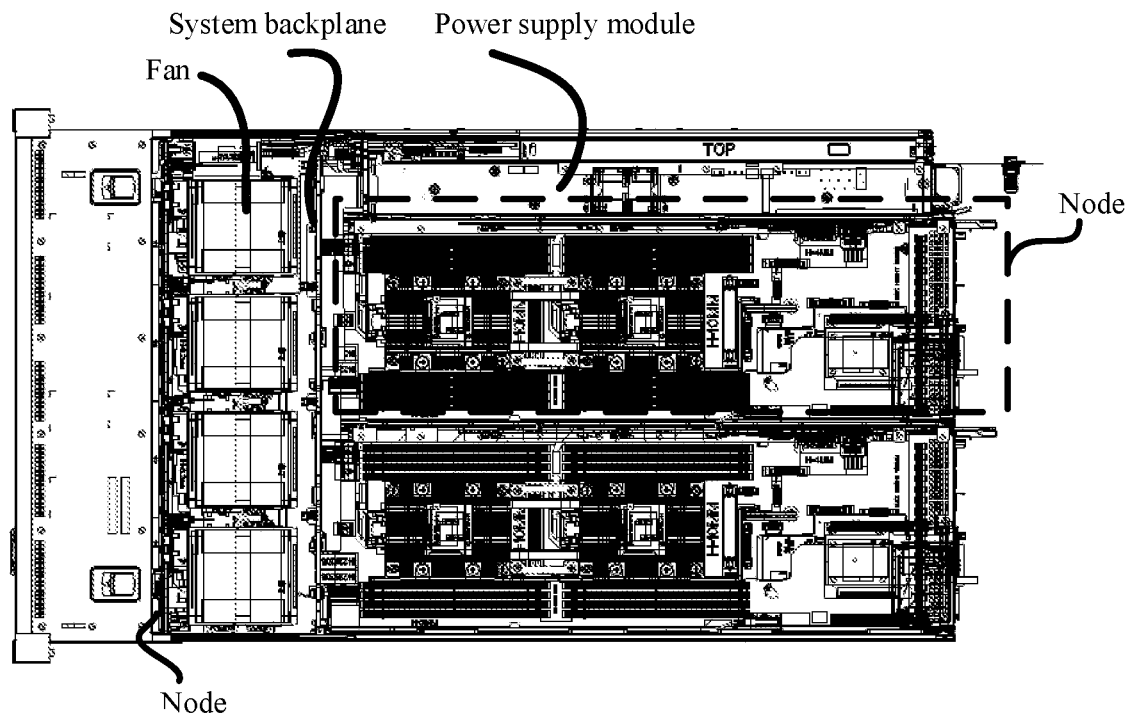
FIG. 1A is a schematic diagram depicting a structure of a server.

FIG. 1A is a schematic top view of a multi-node server. The multi-node server includes a plurality of nodes, a hard disk backplane, a system backplane, a fan, and an external power supply module.

The power supply module is arranged on one side of the nodes, and is connected to the plurality of nodes of the multi-node server through the system backplane, to supply power to the plurality of nodes. The hard disk backplane may also be connected to the plurality of nodes of the multi-node server through the system backplane. In this way, the plurality of nodes can perform read and write operations on a hard disk plugged into the hard disk backplane.

The fan is arranged between the hard disk backplane and the system backplane. The fan is used for generating cold air to cool components in the server. The hard disk backplane can be used for plugging a hard disk in the server. The hard disk backplane and the system backplane are perpendicular to an air direction in the server, which hinders air circulated in the server.

Figure 1B:
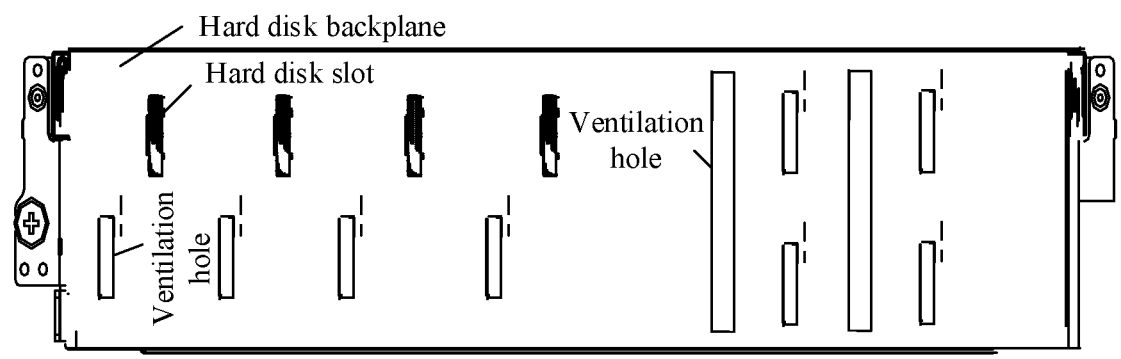
FIG. 1B is a schematic diagram depicting a structure of a hard disk backplane.

FIG. 1B is a schematic diagram depicting a structure of a hard disk backplane. The hard disk in the server may be plugged into the hard disk backplane. In addition to a hard disk slot for plugging a hard disk, ventilation holes may be further formed in the hard disk backplane. However, some elements further need to be deployed on the hard disk backplane, and there are a limited number of positions on the hard disk backplane for forming holes, so that the hard disk backplane can be provided with only a few of ventilation holes. A small number of ventilation holes cannot effectively improve a heat dissipation capability of the server.

Figure 1C:
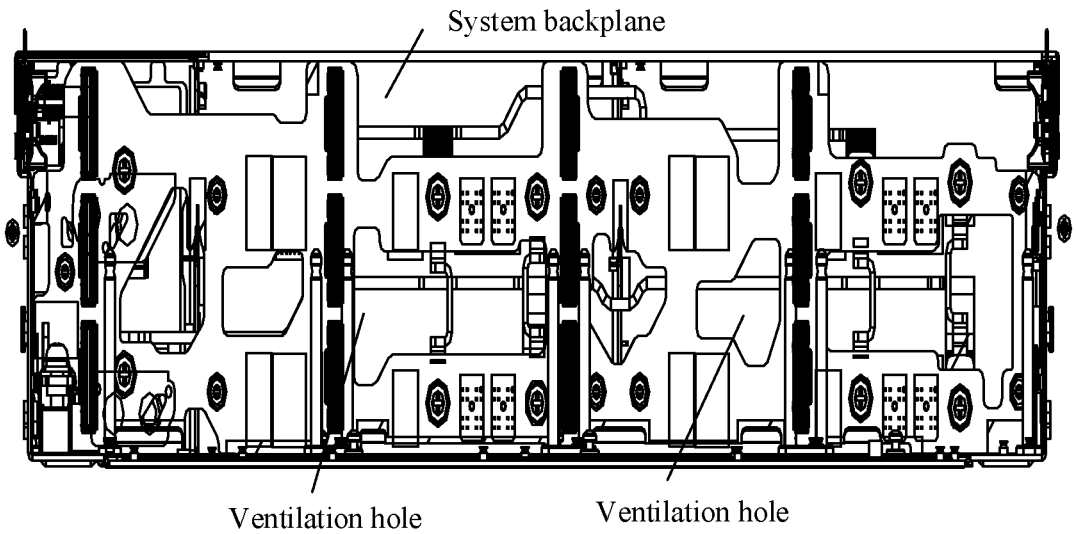
FIG. 1C is a schematic diagram depicting a structure of a system backplane.

FIG. 1C is a schematic diagram depicting a structure of a system backplane. The system backplane can implement connection between a power supply module and a plurality of nodes, and connection between a hard disk backplane and a plurality of nodes. The system backplane is a printed circuit board (PCB), on which some elements need to be deployed. Similar to the hard disk backplane, the system backplane can be provided with only a few of ventilation holes.

It can be learned from the foregoing that arrangement positions of the components such as the system backplane, the hard disk backplane, the plurality of nodes, and the power supply module in the multi-node server and structures of the components reduce air circulation in the server, and affect the heat dissipation capability of the multi-node server.

Figure 2A:
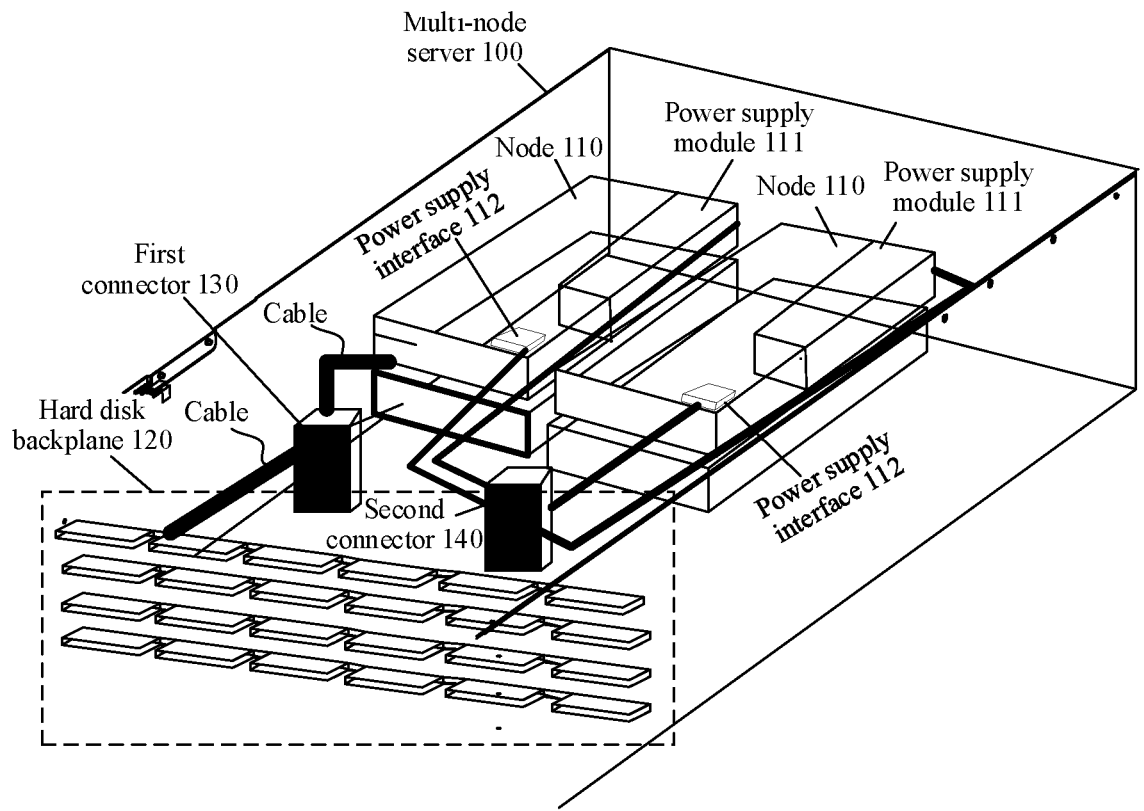
FIG. 2A is a schematic diagram depicting a structure of a multi-node server according to this application.

To improve heat dissipation of a multi-node server and improve a ventilation volume in the multi-node server, an embodiment of this application provides a multi-node server. As shown in FIG. 2A, a schematic diagram depicting a structure of the multi-node server is shown. The multi-node server includes a plurality of nodes 110 and a hard disk backplane 120. Each node 110 includes a built-in power supply module 111.

The plurality of nodes 110 may be connected to the hard disk backplane 120 through a first connector 130.

A second connector 140 is separately connected to the power supply module 111 of each node 110 and a power supply interface 112 of each node 110. That is, the power supply module of each node 110 may be connected to the power supply interface 112 of another node 110 through the second connector. The power supply interface 112 of one node 110 and the power supply module 111 of another node 110 can be connected through the second connector 140. FIG. 2A shows only the connections between the power supply modules 111 as well as the power supply interfaces 112 of some nodes 110 and the second connector 140. Connections between the power supply modules 111 as well as the power supply interfaces 110 of the other nodes 110 and the second connector 140 are similar to the connections shown in FIG. 2A.

The first connector 130 and the second connector 140 may be spaced apart. Air flowing from an air inlet of the multi-node server 100 can circulate in a spacing between the first connector 130 and the second connector 140.

No system backplane is arranged in the multi-node server 100, and the function of the system backplane can be implemented by using the first connector 130 and the second connector 140. In addition, the first connector 130 and the second connector 140 have relatively small volumes, and there is a spacing between the first connector 130 and the second connector 140, so that a ventilation volume in the multi-node server 100 can be increased, and a heat dissipation capability of the multi-node server 100 can be improved.

The following separately describes the first connector and the second connector.

Figure 2B:
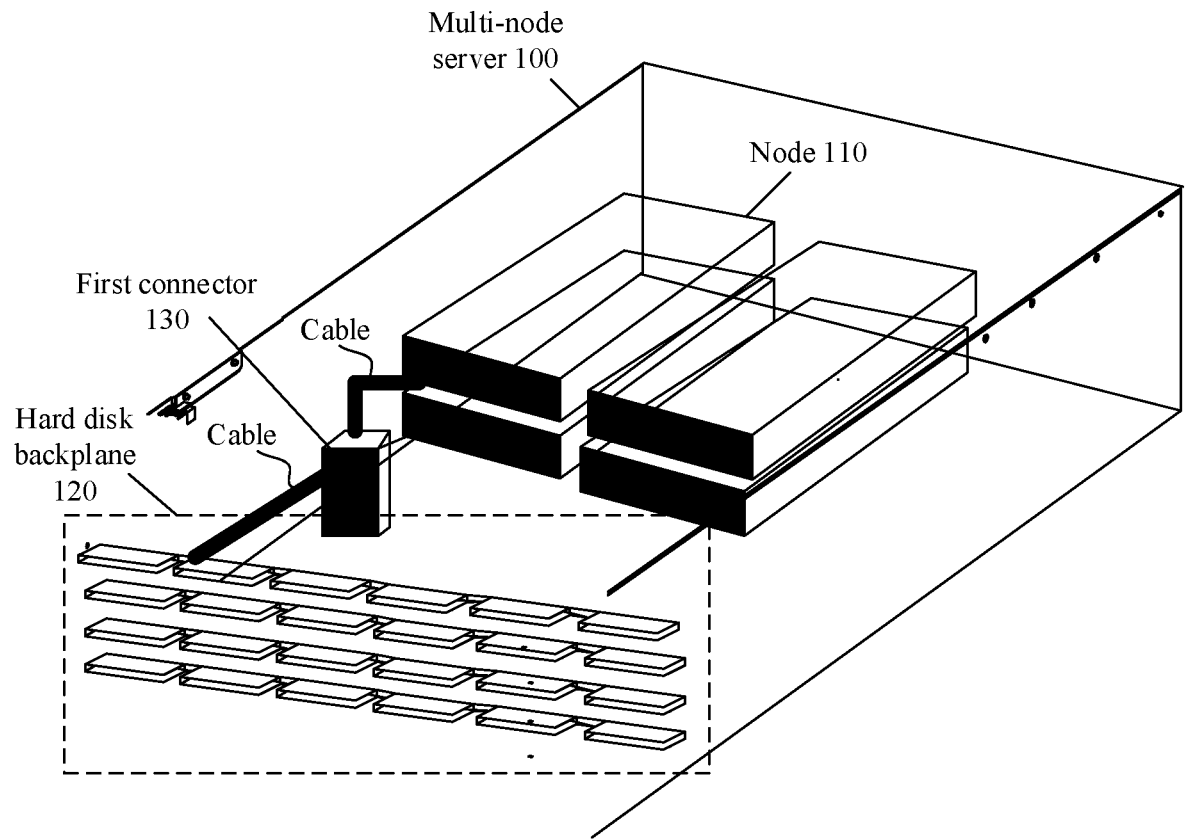
FIG. 2B is a schematic diagram of connections between a first connector and a hard disk backplane, as well as nodes according to this application.

FIG. 2B is a schematic diagram of connections between a first connector 130 and a plurality of nodes 110, and a hard disk backplane 120 according to an embodiment of this application. The plurality of nodes 110 are connected to the hard disk backplane 120 through the first connector 130. The plurality of nodes 110 are connected to the first connector 130 through cables, and the hard disk backplane 120 is connected to the first connector 130 through a cable.

That is, a system backplane with a relatively large volume is not arranged between the plurality of nodes 110 and the hard disk backplane 120, but the first connector 130 with a relatively small volume is used to establish a connection with the hard disk backplane 120.

Compared with the system backplane, the first connector 130 occupies a smaller volume, which can reduce obstruction to the air circulated in the multi-node server, increase a ventilation volume in the server, and improve a heat dissipation capability of the multi-node server to an extent.

Figure 3A:
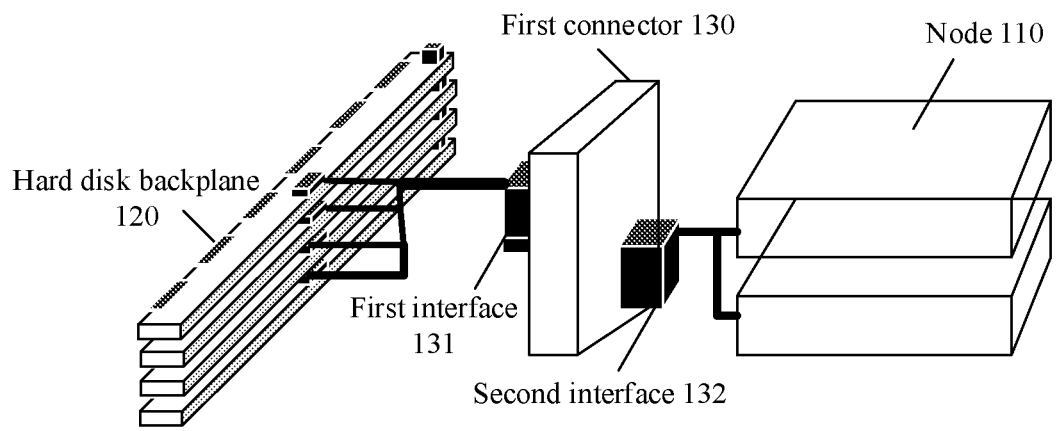
FIG. 3A is a schematic diagram of connections between a first connector and a hard disk backplane, as well as nodes according to this application.

FIG. 3A is a schematic diagram depicting a structure of the first connector 130 according to an embodiment of this application. The first connector 130 is located between the plurality of nodes 110 and the hard disk backplane 120. The first connector 130 includes a first interface 131 and a second interface 132. The first interface 131 faces the plurality of nodes 110. The first interface 131 is connected to the plurality of nodes 110. The second interface 132 faces the hard disk backplane 120, and the second interface 132 is connected to the hard disk backplane 120. Shapes of the first interface 131 and the second interface 132 match sizes of cables that require the first interface 131 and the second interface 132.

The plurality of nodes 110 and the disk backplane are connected to corresponding interfaces of the first connector 130 through cables. That is, the plurality of nodes 110 are connected to the first interface 131 through cables, and the system backplane is connected to the second interface 132 through a cable. Generally, the cables may be integrated. For example, the cables for connecting the plurality of nodes 110 to the first interface 131 are bundled into one bundle that is connected to the first interface 131. A size of the first interface 131 may match an area of a cross section of the bundled cable, so that the first connector 130 can be further small. A size of the second interface 132 is also similar, which may match a cross section of the bundled cable.

Figure 3B:
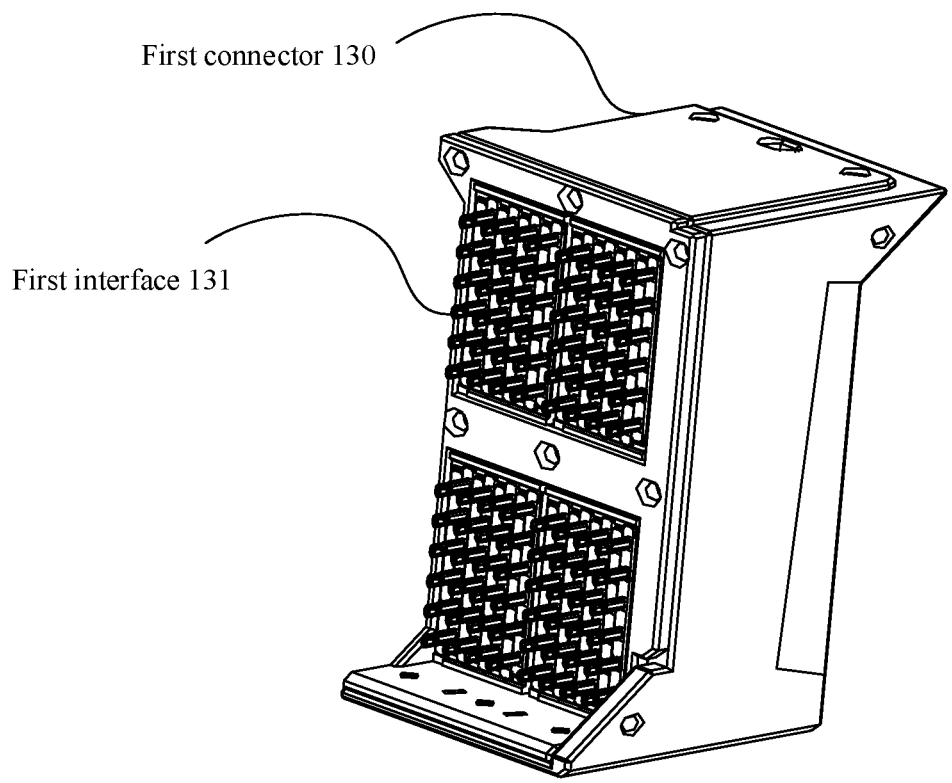
FIG. 3B is a schematic diagram depicting a structure of a first connector according to this application.

FIG. 3B is a schematic diagram of a side on which the first interface 131 of the first connector 130 is located. A structure of the side on which the second interface 132 of the first connector 130 is located is similar to a structure of one side on which the first interface 131 is located. For details, reference may be made to FIG. 3B. It can be learned from the first connector 130 shown in FIG. 3B that the first interface 131 on the first connector 130 may be designed to have a shape that matches the cross section of the bundled cable. For example, areas of the first interface 131 and the second interface 132 are the same as the area of the cross section of the bundled cable. In this way, the first connector 130 occupies a relatively small volume, which can ensure that a relatively large amount of air can be circulated in the server.

Figure 4:
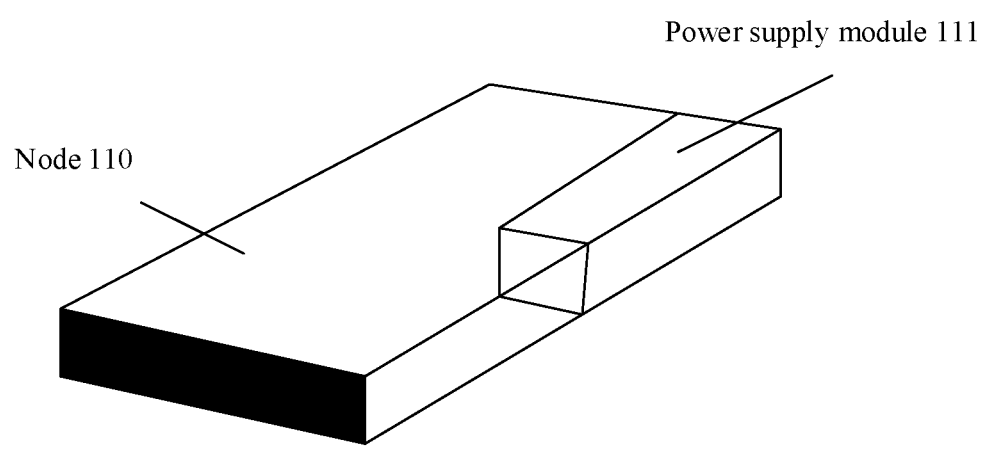
FIG. 4 is a schematic diagram depicting a structure of a node according to this application.

As shown in FIG. 4, to further improve reasonableness of arrangement of components in the multi-node server, each node 110 in the multi-node server may be a node 110 with a built-in power supply module 111. That is, each power supply module 111 is arranged in each node 110, and the power supply module 111 arranged in each node 110 may supply power to the node where it is located. That is, no external power supply module 111 is arranged outside each node 110 of the multi-node server. In this way, no system backplane needs to be provided, and each node 110 does not need to be connected to the external power supply module 111 through the system backplane.

Figure 5A:
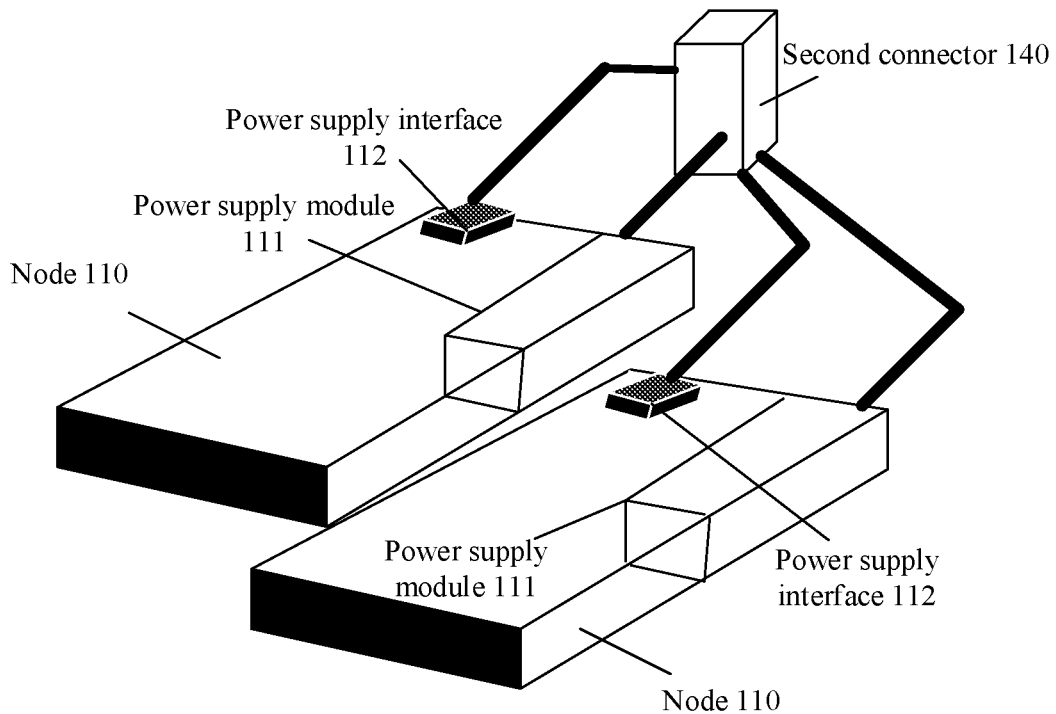
FIG. 5A is a schematic diagram of connections between a second connector and a power supply interface, as well as a power supply module according to this application.

A node with a built-in power supply module 111 can ensure normal running. In addition, to ensure reliability of the multi-node server, when the power supply module 111 of one node fails, the power supply modules 111 of other nodes may be used to supply power to the node, so as to ensure that the node can still work normally. FIG. 5A is a schematic diagram of connections between a second connector 140 and power supply interfaces 112 of a plurality of nodes 110, as well as power supply modules 111 of the plurality of nodes 110 provided according to an embodiment of this application. The second connector 140 is separately connected to the power supply module 111 of each node 110 and the power supply interface 112 of each node 110.

The power supply interface 112 of one node 110 can be connected to the power supply module 111 of another node through the second connector 140, so that when the power supply module 111 of one node 110 fails, the power supply module 111 of another node 110 can be connected to the node through the second connector 140 to supply power to the node. Therefore, the node can work normally.

This embodiment of this application does not limit a shape and an arrangement position of the second connector 140. The arrangement position of the second connector 140 is related to a position of the power supply module 111 of each node 110 and a position of the power supply interface 112 of each node 110. For example, the power supply module 111 of a node and the power supply interface 112 of the node are located on a same side of the node, and the second connector 140 may be located at a position close to the power supply module 111 of the node and the power supply interface 112 of the node, as shown in FIG. 5A. If the power supply module 111 of a node and the power supply interface 112 of the node are located on different sides of the node, the second connector 140 may be arranged at a position close to the power supply module 111 of each node 110 or the power supply interface 112 of each node 110.

Figure 5B:
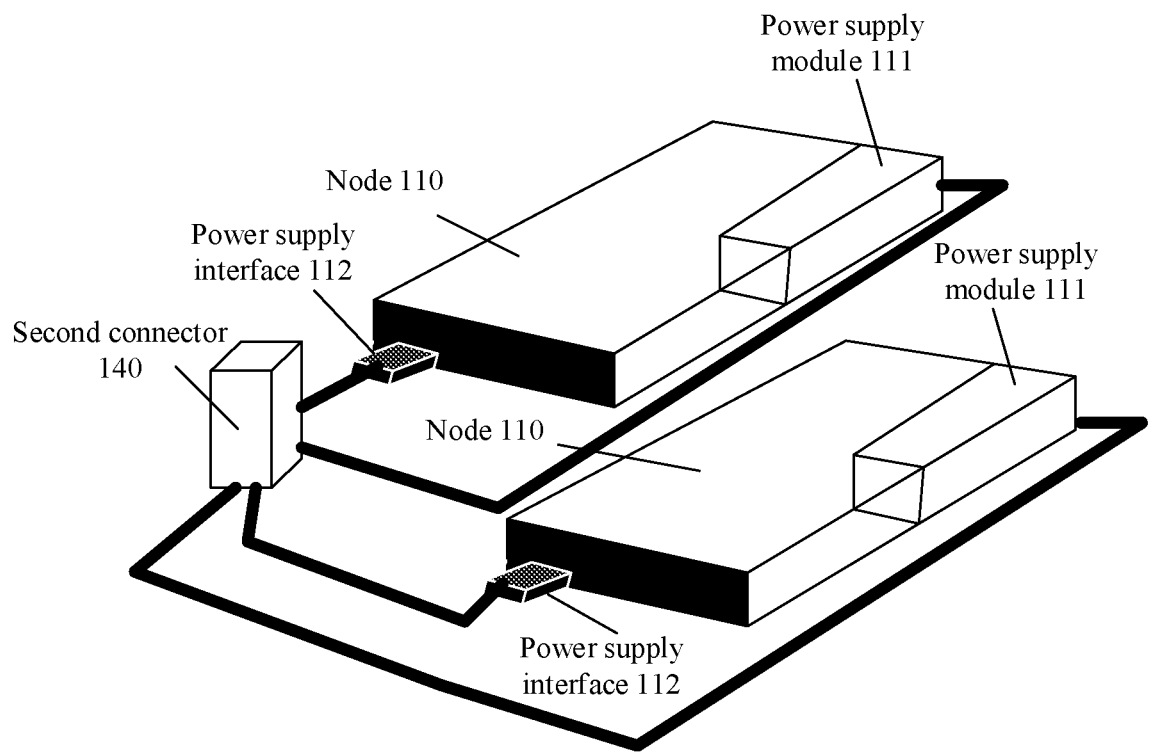
FIG. 5B is a schematic diagram of connections between a second connector and a power supply interface, as well as a power supply module according to this application.

As shown in FIG. 5B, the power supply module 111 of a node and the power supply interface 112 of the node are located on different sides of the node. The second connector 140 may be arranged at a position close to the power supply interface 112 of each node 110. The second connector 140 may be located between the plurality of nodes 110 and the hard disk backplane 120. The power supply module 111 of each node 110 is connected to the second connector 140 through a connection cable.

This embodiment of this application does not limit a material of the connection cable used for connecting the power supply module 111 of each node 110 with the second connector 140. For example, the connection cable may be a copper bar that has high conductivity and can ensure that the second connector 140 and the power supply module 111 of each node 110 can achieve a better connection effect. In addition, the copper bar has high plasticity, which can better abut against the components in the multi-node server. The copper bar may be flat and has a relatively small volume. In addition, the copper bar will not cause high air resistance to the air in the multi-node server. The connection cable may also be a connection cable made of other materials.

Figure 6:
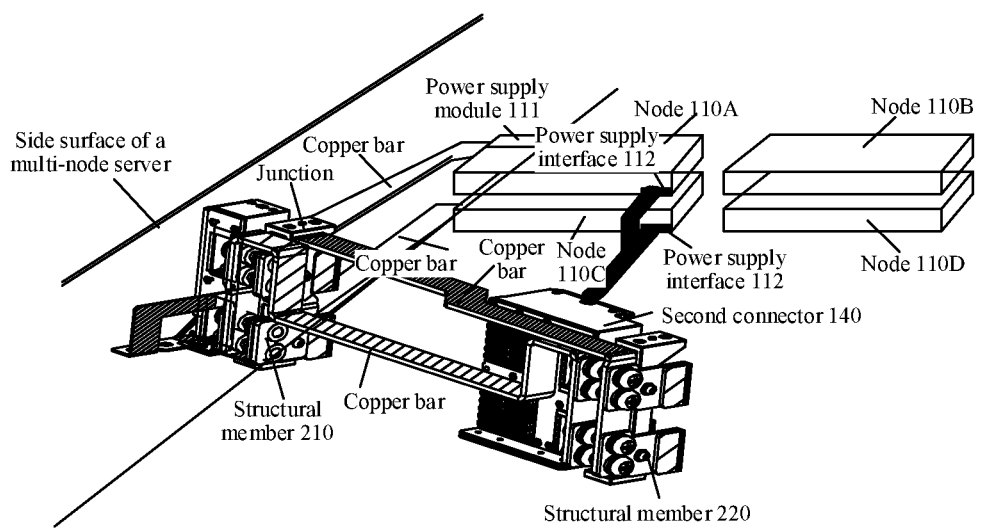
FIG. 6 is a schematic diagram of connections between a second connector and a power supply interface, as well as a power supply module according to this application.

FIG. 6 is a schematic diagram depicting a structure of a second connector 140 provided according to an embodiment of this application. The second connector 140 may be connected to the power supply module 111 of each node 110 through a copper bar. The second connector 140 is then connected to the power supply interface 112 of each node 110. In FIG. 6, the plurality of nodes 110 are arranged in a hierarchical manner. That there are four nodes 110 is used as an example. To distinguish the four nodes 110, a node 110A, a node 110B, a node 110C, and a node 110D are included. The node 110A and the node 110B are located at an upper layer, and the node 110C and the node 110D are located at a lower layer.

FIG. 6 shows only a manner for connecting the power supply module 111 of the node 110A and the power supply module 111 of the node 110C to the second connector 140. The node 110B and the node 110D may also be connected to the second connector 140 in a similar manner. The power supply module 111 of the node 110A is connected to the second connector 140 through a copper bar, and the power supply module 111 of the node 110C is connected to the second connector 140 through another copper bar. In FIG. 6, the power supply modules 111 of the various nodes 110 and the power supply interfaces 112 of the nodes 110 are located on different sides, and the copper bar connecting the power supply module 111 of the node 110A extends along a side surface of the multi-node server 100 to a plane on which the second connector 140 is located. If the second connector 140 is arranged close to a side surface of the multi-node server 100, the copper bar may be directly connected to the second connector 140 along the side surface of the multi-node server 100. In FIG. 6, the second connector 140 is arranged far away from the side surface of the multi-node server 100. For example, the second connector is located in the middle of the multi-node server 100 (that is, the second connector is not close to any side surface of the multi-node server 100, and a value of a distance from the second connector to any side surface of the multi-node server 100 is greater than a preset value). The copper bar may be bent along the side surface of the multi-node server 100 to the plane on which the second connector 140 is located, and is connected to the second connector 140.

The two copper bars are parallel to an air direction in the server. There is a spacing between the two copper bars, so that the air in the multi-node server can circulate through the spacing.

In FIG. 6, to improve stability of the copper bars, one or more structural members may be additionally arranged to fasten the copper bars. In FIG. 6, two structural members are drawn as an example: a structural member 210 and a structural member 220. The structural member 210 is located at a junction between a side surface of the multi-node server 100 and the plane on which the second connector 140 is located. The structural member 210 may secure the copper bars on the junction to ensure the stability of the copper bars. A quantity of the copper bars and a quantity of the structural members 210 are not limited here. One structural member 210 may fasten one copper bar at the junction, or may fasten a plurality of copper bars at the junction.

The structural member 220 is located on a side surface of the second connector 140. The structural member 220 may fasten the copper bar on the side surface of the second connector 140, so as to ensure that the copper bar can be connected to the second connector 140, and also ensure the stability of the copper bar. A quantity of the structural members 220 is not limited here either. One structural member 220 may fasten one copper bar on the side surface of the second connector 140, or may fasten a plurality of copper bars on the side surface of the second connector 140.

Figure 7A:
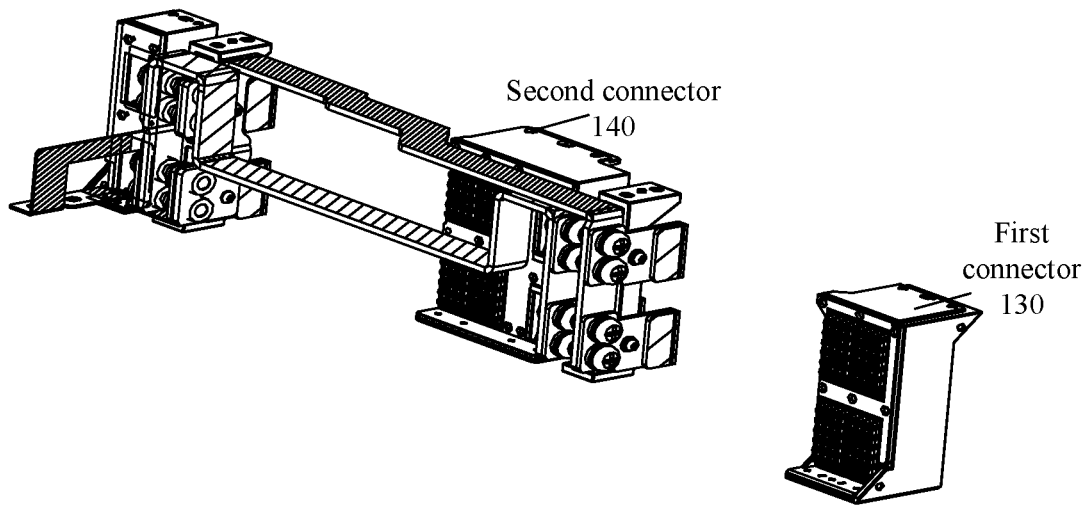
FIG. 7A is a schematic diagram depicting a structure of a first connector and a second connector according to this application.

In actual applications, the first connector 130 and the second connector 140 may be deployed on a same plane. The plane may be located between the hard disk backplane 120 and the plurality of nodes 110. FIG. 7A is a schematic diagram of the first connector 130 and the second connector 140. The first connector 130 can connect the plurality of nodes 110 to the hard disk backplane 120, and the second connector 140 can connect the power supply module 111 arranged in each node 110 to another node. That is, the first connector 130 and the second connector 140 can implement the function of the system backplane in the multi-node server shown in FIG. 1. However, compared with the system backplane in FIG. 1C, the first connector 130 and the second connector 140 occupy a smaller volume. In addition, the second connector 140 is connected to the power supply modules 111 of the various nodes through connection cables (for example, copper bars), and the connection cables are spaced apart from one another, so as to ensure circulation of the air in the multi-node server.

Figure 7B:
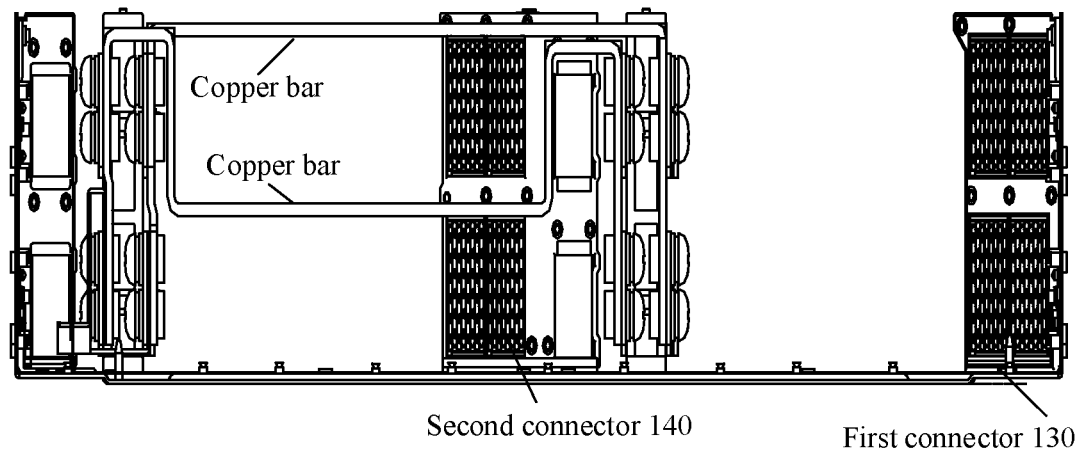
FIG. 7B is a schematic diagram depicting a structure of a first connector and a second connector according to this application.

FIG. 7B is a schematic plane diagram of a first connector 130 and a second connector 140. The first connector 130 is arranged close to a side surface of the multi-node server 100, for example, may be next to the side surface of the multi-node server 100. The second connector 140 is arranged in the middle, which is away from the side surface of the multi-node server 100. Compared with the system backplane shown in FIG. 1C, there are a plurality of spacings between the first connector 130 and the second connector 140, so that the air in the multi-node server can better circulate, and the heat dissipation capability of the multi-node server can be improved.

The system backplane in the multi-node server is replaced by the first connector 130 and the second connector 140. For the hard disk backplane 120 in the multi-node server, a design that can improve the heat dissipation capability of the multi-node server may also be used. The following describes a hard disk backplane 120 provided in an embodiment of this application.

Figure 8:
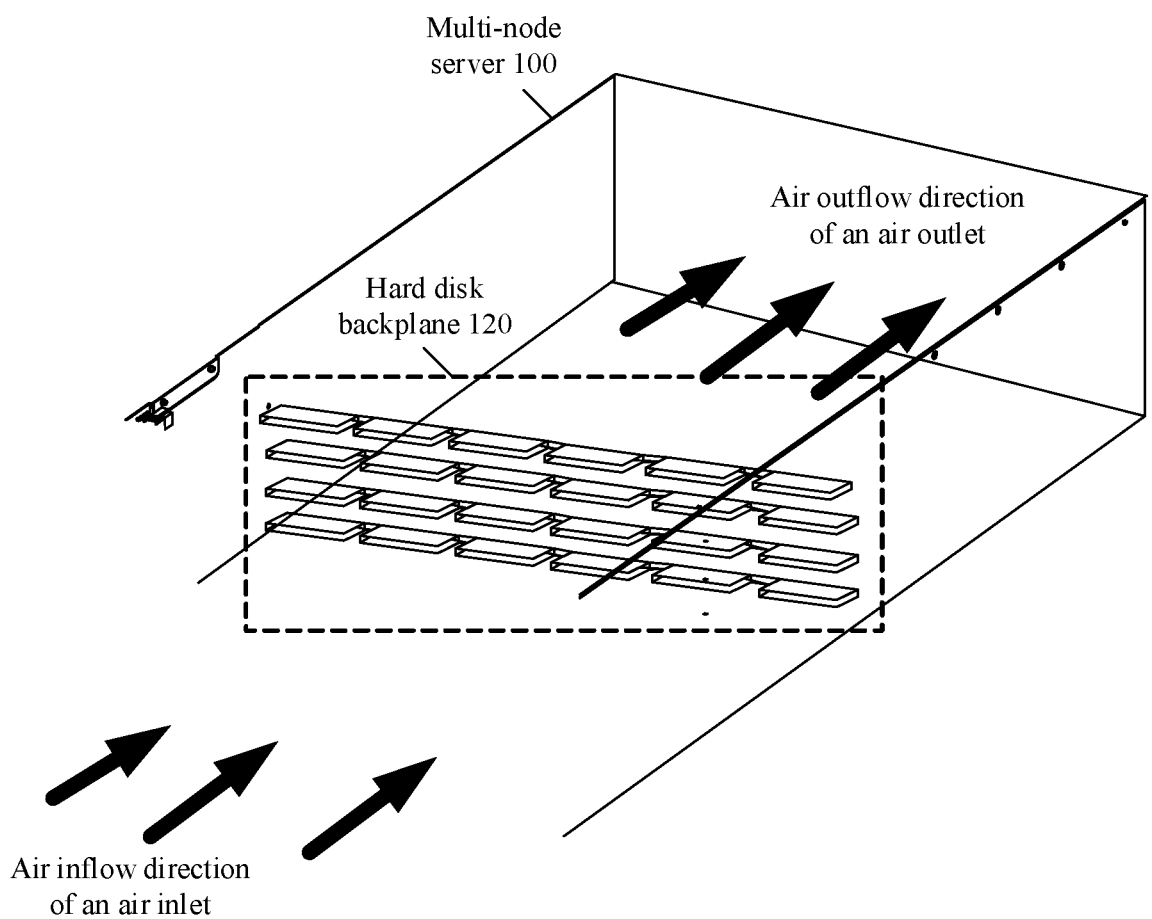
FIG. 8 is a schematic diagram depicting a structure of a hard disk backplane according to this application.

FIG. 8 is a schematic diagram of a hard disk backplane 120 of a multi-node server provided according to an embodiment of this application. The hard disk backplane 120 is parallel to an air inflow direction of an air inlet in the multi-node server, or may be parallel to an air outflow direction of an air outlet of the multi-node server.

In embodiments of this application, an example in which the air inflow direction of the air inlet is consistent with the air outflow direction of the air outlet is used for description. For a case in which the air inflow direction of the air inlet is inconsistent with the air outflow direction of the air outlet, the hard disk backplane 120 may be parallel to either of the air inflow direction of the air inlet and the air outflow direction of the air outlet.

For a relationship between the hard disk backplane 120 and the air inflow direction of the air inlet and the air outflow direction of the air outlet, the hard disk backplane 120 may be abstracted as a spatial plane (the spatial plane may be referred to as corresponding to the hard disk backplane 120), and the air inflow direction of the air inlet (or the air outflow direction of the air outlet) may be abstracted as a group of straight space lines (the group of straight space lines may be referred to as corresponding to the air inflow direction of the air inlet or straight space lines corresponding to the air outflow direction of the air outlet).

That the hard disk backplane 120 is parallel to the air inflow direction of the air inlet means that the spatial plane corresponding to the hard disk backplane 120 is parallel to the straight space lines corresponding to the air inflow direction of the air inlet. That the hard disk backplane 120 is parallel to the air outflow direction of the air outlet means that the spatial plane corresponding to the hard disk backplane 120 is parallel to the straight space lines corresponding to the air outflow direction of the air outlet.

In the multi-node server shown in FIG. 8, the hard disk backplane 120 is arranged along a width direction of the multi-node server (the width direction refers to a direction between a left side and a right side of the multi-node server). That is, two ends of the hard disk backplane 120 may be respectively fastened on the left side and the right side of the multi-node server. The hard disk backplane 120 is parallel to the air inflow direction of the air inlet.

The hard disk backplane 120 is arranged in a direction parallel to an air direction (for example, the air inflow direction of the air inlet and the air outflow direction of the air outlet). The hard disk backplane 120 can greatly reduce obstruction to air entering the multi-node server, so that a ventilation volume of the multi-node server can be effectively increased, thereby improving the heat dissipation capability of the multi-node server.

When a hard disk is plugged into the hard disk backplane 120, the hard disk may be plugged into the hard disk backplane 120 along a direction parallel to the hard disk backplane 120. In this way, the hard disk is also parallel to the air inflow direction of the air inlet. The hard disk plugged into the hard disk backplane 120 will not cause great obstruction to the air entering the multi-node server, either, thereby further ensuring the ventilation volume of the multi-node server.

The following describes a structure of the hard disk backplane 120.

The hard disk backplane 120 may include one or more layers of PCBs 121. One or more hard disk slots may be arranged on the one layer of PCB 121, and hard disks can be plugged in the hard disk slots. For a direction in which the hard disk is housed, refer to the foregoing descriptions. Details are not described herein again.

When the hard disk backplane 120 includes a plurality of layers of PCBs 121, the plurality of layers of PCBs 121 are arranged in parallel. There are various manners for disposing the plurality of layers of PCBs 121 in parallel. For example, the plurality of layers of PCBs 121 may be located on a same plane, or may be separately located on a plurality of different parallel planes. Several of the manners are listed below.

Figure 9A:
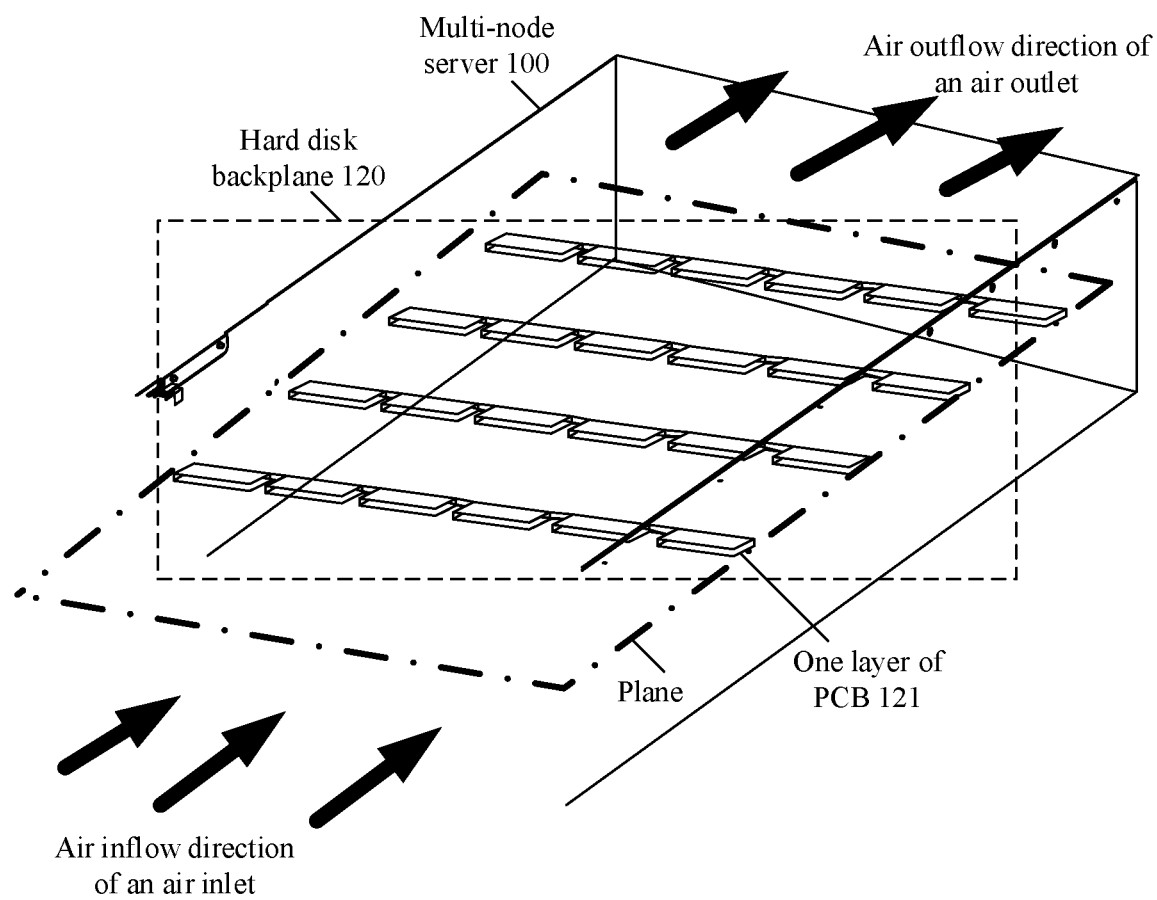
FIG. 9A is a schematic diagram of arrangement of a plurality of layers of PCBs in a hard disk backplane according to this application.

FIG. 9A is a schematic diagram depicting a structure of a multi-node server provided according to an embodiment of this application. The hard disk backplane 120 includes a plurality of layers of PCBs 121. The plurality of layers of PCBs 121 are located on a same plane. The plane is parallel to an air inflow direction of an air inlet.

It can be seen from FIG. 9A that the plurality of layers of PCBs 121 in the hard disk backplane 120 are arranged side by side along a direction parallel to the air inflow direction of the air inlet.

The plurality of layers of PCBs 121 may be spaced apart from one another and are arranged in a sparse manner. Alternatively, there may be no spacings, and the plurality of layers of PCBs 121 may be arranged in a tight manner.

In this manner, the plurality of layers of PCBs 121 are located on the same plane, and the obstruction by the hard disk backplane 120 to the air entering the multi-node server will be greatly reduced, so that the amount of air circulated in the entire multi-node server increases, thereby improving the heat dissipation capability of the multi-node server.

Figure 9B:
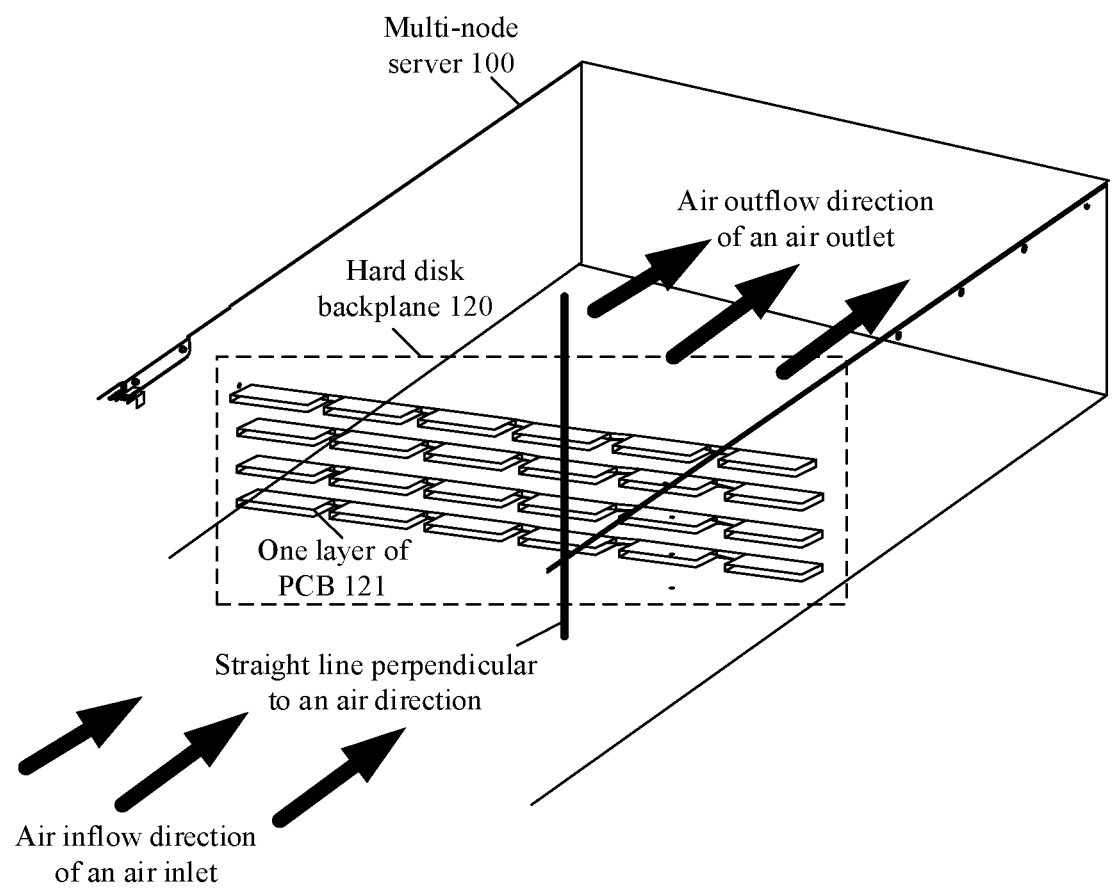
FIG. 9B is a schematic diagram of arrangement of a plurality of layers of PCBs in a hard disk backplane according to this application.

FIG. 9B is a schematic diagram depicting a structure of a multi-node server provided according to an embodiment of this application. The hard disk backplane 120 includes a plurality of layers of PCBs 121. The plurality of layers of PCBs 121 are located on a plurality of different parallel planes. The plurality of parallel planes are parallel to an air inflow direction of an air inlet. That is, the plurality of layers of PCBs 121 includes PCBs 121 located on different planes.

A quantity of the plurality of planes is not limited here. The quantity of the plurality of parallel planes may be the same as a quantity of the plurality of layers of PCBs 121. That is, one layer of PCB 121 is located on one plane.

The plurality of layers of PCBs 121 intersect with a same straight line, and are all perpendicular to the straight line. The straight line is perpendicular to the air inflow direction of the air inlet. That is, the plurality of layers of PCBs 121 are aligned in the direction perpendicular to the air inflow direction of the air inlet, and projections of the plurality of layers of PCBs 121 on the plane perpendicular to the air inflow direction of the air inlet overlap.

To further improve the heat dissipation capability of the multi-node server, there is a spacing between adjacent PCBs in the plurality of layers of PCBs 121 in the direction perpendicular to the air inflow direction of the air inlet. In this way, the air entering the multi-node server may flow through these spacings, so that a ventilation rate of the multi-node server is increased.

In this manner, the plurality of layers of PCBs 121 are arranged in the multi-node server in a centralized manner, and occupy a relatively small space. In addition, because the plurality of layers of PCBs 121 are parallel to air flowing into the air inlet, the obstruction to the air can be reduced, and heat dissipation of the multi-node server is ensured.

Figure 10:
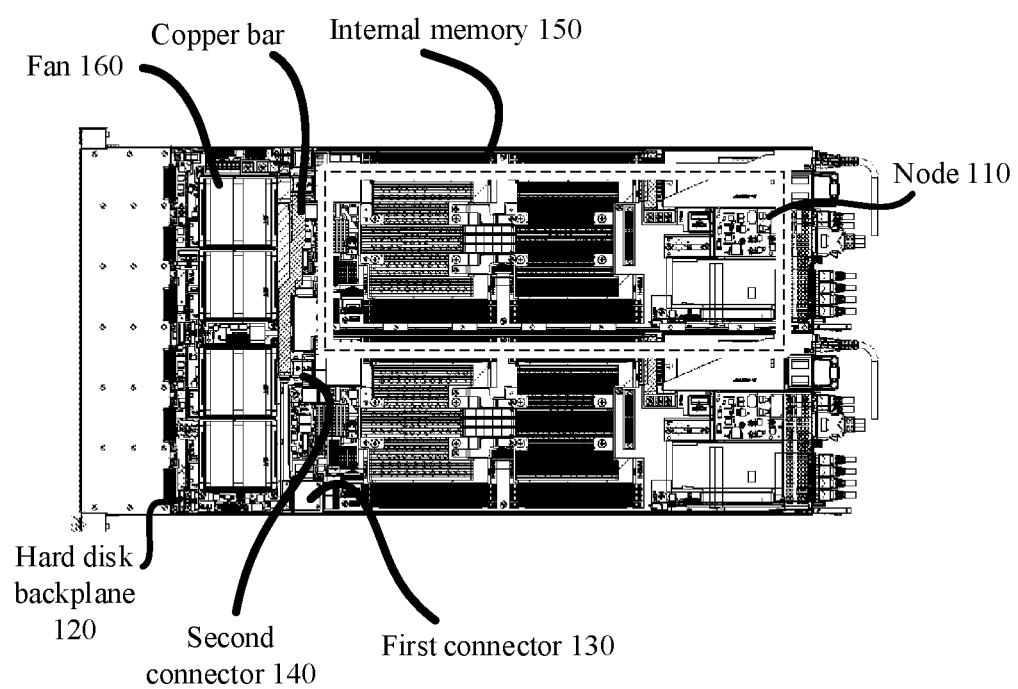
FIG. 10 is a schematic diagram depicting a structure of a server according to this application.

FIG. 10 is a schematic top view of a multi-node server in an embodiment of this application. The multi-node server includes nodes 110 with a plurality of built-in power supply modules 111, a first connector 130, a hard disk backplane 120, and a second connector 140.

The first connector 130 and the second connector 140 may be located between the hard disk backplane 120 and the plurality of nodes 110. The first connector 130 is configured to connect the plurality of nodes 110, and the second connector 140 is configured to connect the power supply modules 111 arranged in the plurality of nodes 110 to the power supply interfaces 112 of the plurality of nodes 110.

The nodes are provided with the built-in power supply modules 111, so that a layout of the various components in the multi-node server is more compact, and there are still some free deployment space. In the free deployment space, internal memories 150 may be further arranged, so as to increase a quantity of internal memories in the multi-node server. The internal memories 150 may be connected to the plurality of nodes 110. A connection manner between the internal memories 150 and the plurality of nodes 110 is not limited here. For example, a connection may be established by using an additional connector, or a connection may be established by using the second connector 140. That is, the second connector 140 can not only achieve a connection between the power supply module 111 of a node 110 and the power supply interface 112 of another node 110, but also achieve a connection between the internal memories 150 and the plurality of nodes 110.

Generally, when a height of the multi-node server is 2 U, and a quantity of nodes of the multi-node server is 4, the multi-node server is a 2 U4 server. If the 2 U4 server uses the structure as shown in FIG. 1A, the multi-node server includes 16 internal memories 150, but if the structure as shown in FIG. 10 is used, the multi-node server may include more than 16 internal memories 150.

The multi-node server may further include a fan 160. The fan is located between the hard disk backplane 120 and the first connector 130, and generates air circulated in the multi-node server.

It is clear that a person skilled in the art can make various modifications and variations to this application without departing from the scope of this application. This application is intended to cover these modifications and variations of this application provided that they fall within the scope of protection defined by the following claims and their equivalent technologies.

What is claimed is:

1. A multi-node server, comprising:
a plurality of nodes; and
a hard disk backplane,
wherein each node of the plurality of nodes comprises a corresponding built-in power supply module,
wherein the hard disk backplane is connected to the plurality of nodes through a first connector,
wherein the corresponding built-in power supply module of the each node is connected to a corresponding power supply interface of another node of the plurality of nodes through a second connector,
wherein the first connector and the second connector are spaced apart, and
wherein air flowing from an air inlet of the multi-node server circulates through a spacing between the first connector and the second connector.

2. The multi-node server according to claim 1, wherein the first connector and the second connector are located on a same plane located between the plurality of nodes and the hard disk backplane.

3. The multi-node server according to claim 1, wherein the corresponding built-in power supply module of the each node is connected to the second connector through a corresponding copper bar, and there is a second spacing between a plurality of copper bars connecting corresponding built-in power supply modules of the plurality of nodes and the second connector.

4. The multi-node server according to claim 1, wherein the first connector is arranged close to a side surface of the multi-node server.

5. The multi-node server according to claim 4, wherein the second connector is arranged toward corresponding power supply interfaces of the plurality of nodes, and the second connector is arranged in a middle of the multi-node server and is away from the side surface of the multi-node server.

6. The multi-node server according to claim 5, wherein corresponding built-in power supply modules and the corresponding power supply interfaces of the plurality of nodes are located on different side surfaces of the plurality of nodes, and a plurality of copper bars connecting the corresponding built-in power supply modules of the plurality of nodes are bent along the side surface of the multi-node server to a plane on which the second connector is located and are connected to the second connector.

7. The multi-node server according to claim 6, wherein the plurality of copper bars connecting the corresponding built-in power supply modules of the plurality of nodes are fastened on a second side surface of the second connector by using a first structural member.

8. The multi-node server according to claim 6, wherein the plurality of copper bars are fastened on a junction of the side surface of the multi-node server and the plane on which the second connector is located by using a second structural member.

9. The multi-node server according to claim 1, wherein the hard disk backplane is parallel to an air inflow direction of the air inlet in the multi-node server or an air outflow direction of an air outlet in the multi-node server.

10. The multi-node server according to claim 1, wherein at least one hard disk is plugged into the hard disk backplane, and the at least one hard disk is plugged into the hard disk backplane in a direction parallel to an air inflow direction of the air inlet or an air outflow direction of an air outlet in the multi-node server.

11. The multi-node server according to claim 1, wherein the hard disk backplane comprises a plurality of layers of printed circuit boards (PCBs), and each layer of the plurality of layers of PCBs is arranged in parallel.

12. The multi-node server according to claim 11, wherein the plurality of layers of PCBs have spacings in a direction perpendicular to an air inflow direction of the air inlet or an air outflow direction of an air outlet in the multi-node server.

13. The multi-node server according to claim 1, wherein the multi-node server further comprises a fan, and the fan is located between the hard disk backplane and the plurality of nodes.

14. The multi-node server according to claim 1, wherein a height of the multi-node server is 2 rack units (2 U), a quantity of the plurality of nodes of the multi-node server is 4, wherein the multi-node server comprises N internal memories, and wherein N is a positive integer greater than 16.

15. A cabinet server, comprising:
a multi-node server, the multi-node server comprising a plurality of nodes and a hard disk backplane,
wherein each node of the plurality of nodes comprises a corresponding built-in power supply module,
wherein the hard disk backplane is connected to the plurality of nodes through a first connector,
wherein the corresponding built-in power supply module of the each node is connected to a corresponding power supply interface of another node of the plurality of nodes through a second connector,
wherein the first connector and the second connector are spaced apart, and
wherein air flowing from an air inlet of the multi-node server circulates through a spacing between the first connector and the second connector.

16. The cabinet server of claim 15, wherein the first connector and the second connector are located on a same plane located between the plurality of nodes and the hard disk backplane.

17. The cabinet sever of claim 15, wherein the corresponding built-in power supply module of the each node is connected to the second connector through a corresponding copper bar, and there is a second spacing between a plurality of copper bars connecting corresponding built-in power supply modules of the plurality of nodes and the second connector.

18. The cabinet sever of claim 15, wherein the first connector is arranged close to a side surface of the multi-node server.

19. The cabinet sever of claim 18, wherein the second connector is arranged toward corresponding power supply interfaces of the plurality of nodes, and the second connector is arranged in a middle of the multi-node server and is away from the side surface of the multi-node server.

20. A blade server, comprising:
a multi-node server, the multi-node server comprising a plurality of nodes and a hard disk backplane,
wherein each node of the plurality of nodes comprises a corresponding built-in power supply module,
wherein the hard disk backplane is connected to the plurality of nodes through a first connector,
wherein the corresponding built-in power supply module of the each node is connected to a corresponding power supply interface of another node of the plurality of nodes through a second connector,
wherein the first connector and the second connector are spaced apart, and
wherein air flowing from an air inlet of the multi-node server circulates through a spacing between the first connector and the second connector.

* * * * *

UNITED STATES PATENT AND TRADEMARK OFFICE
CERTIFICATE OF CORRECTION

| | | |
|---|---|---|
| PATENT NO. | : 12,309,957 B2 | Page 1 of 1 |
| APPLICATION NO. | : 18/187008 | |
| DATED | : May 20, 2025 | |
| INVENTOR(S) | : Yao et al. | |

It is certified that error appears in the above-identified patent and that said Letters Patent is hereby corrected as shown below:

In the Claims

In Column 13, in Claim 14, Line 36, delete "(2 U)," and insert -- (2U), --.

Signed and Sealed this
Eighth Day of July, 2025

Coke Morgan Stewart
*Acting Director of the United States Patent and Trademark Office*